United States Patent
Cho et al.

(10) Patent No.: US 9,111,789 B2
(45) Date of Patent: Aug. 18, 2015

(54) THIN FILM TRANSISTOR ARRAY PANEL

(71) Applicant: Samsung Display Co., Ltd., Yongin (KR)

(72) Inventors: Byung Su Cho, Asan-si (KR); Hyeong Tag Jeon, Seoul (KR); Jae Sang Lee, Seoul (KR)

(73) Assignees: SAMSUNG DISPLAY CO., LTD. (KR); IUCF-HYU (INDUSTRY-UNIVERSITY COOPERATION FOUNDATION HANYANG UNIVERSITY) (KR)

( * ) Notice: Subject to any disclaimer, the term of this patent is extended or adjusted under 35 U.S.C. 154(b) by 0 days.

(21) Appl. No.: 14/209,066

(22) Filed: Mar. 13, 2014

(65) Prior Publication Data

US 2014/0361304 A1    Dec. 11, 2014

(51) Int. Cl.
  *H01L 29/786* (2006.01)
  *H01L 29/10* (2006.01)

(52) U.S. Cl.
  CPC ........ *H01L 29/1033* (2013.01); *H01L 29/7869* (2013.01); *H01L 29/78669* (2013.01); *H01L 29/78678* (2013.01)

(58) Field of Classification Search
  CPC .............. H01L 29/1033; H01L 29/78669; H01L 29/7869; H01L 29/78678
  USPC ................................... 257/66, 368
  See application file for complete search history.

(56) References Cited

U.S. PATENT DOCUMENTS

| | | | |
|---|---|---|---|
| 7,262,991 B2 * | 8/2007 | Zhang et al. | 365/185.01 |
| 7,378,711 B2 | 5/2008 | Suh et al. | |
| 7,507,618 B2 | 3/2009 | Dunbar | |
| 7,691,666 B2 | 4/2010 | Levy et al. | |
| 7,812,342 B2 | 10/2010 | Lee et al. | |
| 7,897,430 B2 | 3/2011 | Kim et al. | |
| 8,309,961 B2 | 11/2012 | Yamazaki et al. | |

(Continued)

FOREIGN PATENT DOCUMENTS

| KR | 100659056 | 12/2006 |
|---|---|---|
| KR | 100792036 | 1/2008 |

(Continued)

OTHER PUBLICATIONS

Sang Yeol Lee et al., "Effect of channel thickness on density of states in amorphous InGaZnO thin film transistor," Applied Physics Letters, vol. 98, 2011, 122105-122105-3. Published online Mar. 22, 2011.

(Continued)

*Primary Examiner* — Allan R Wilson
(74) *Attorney, Agent, or Firm* — Cantor Colburn LLP

(57) ABSTRACT

A thin film transistor array panel includes: a substrate; a gate electrode disposed on the substrate; a semiconductor layer disposed on the substrate and overlapping the gate electrode; a plurality of nano particles disposed on or in the semiconductor layer; a source electrode disposed on the substrate; and a drain electrode disposed on the substrate, where the source electrode and the drain electrode are spaced apart from each other, and the semiconductor layer is disposed between the source electrode and the drain electrode, in which a diameter of each of the nano particles is in a range of about 2 nm to about 5 nm, or a ratio of a plane area of the nano particles per unit area of the semiconductor layer is in a range of about 5% to about 80%.

10 Claims, 10 Drawing Sheets

(56) References Cited

U.S. PATENT DOCUMENTS

| | | |
|---|---|---|
| 8,324,621 B2 | 12/2012 | Yamazaki et al. |
| 2005/0189883 A1 | 9/2005 | Suh et al. |
| 2007/0012988 A1* | 1/2007 | Bhattacharyya ............ 257/314 |
| 2007/0052024 A1 | 3/2007 | Lee et al. |
| 2007/0246784 A1 | 10/2007 | Kang et al. |
| 2008/0252209 A1* | 10/2008 | Jang et al. ............... 313/506 |
| 2009/0218605 A1* | 9/2009 | Jain .......................... 257/288 |
| 2011/0210386 A1* | 9/2011 | Sandhu et al. ............. 257/325 |
| 2012/0211745 A1 | 8/2012 | Ueda et al. |
| 2014/0034944 A1* | 2/2014 | Zan et al. .................. 257/43 |

FOREIGN PATENT DOCUMENTS

| | | |
|---|---|---|
| KR | 1020080096186 | 10/2008 |
| KR | 100891457 | 4/2009 |
| KR | 1020090051439 | 5/2009 |
| KR | 100977189 | 8/2010 |
| KR | 100986148 | 10/2010 |
| KR | 101243791 | 3/2013 |

OTHER PUBLICATIONS

Byungsu Cho, et al. "Electrical stability enhancement of the amorphous In—Ga—Zn—O thin film transistor by formation of Au nanoparticles on the back-channel surface," Applied Physics Letters, vol. 102, 2013, 102108-102108-4, published online Mar. 13, 2013.

* cited by examiner

FIG. 10A
FIG. 10B
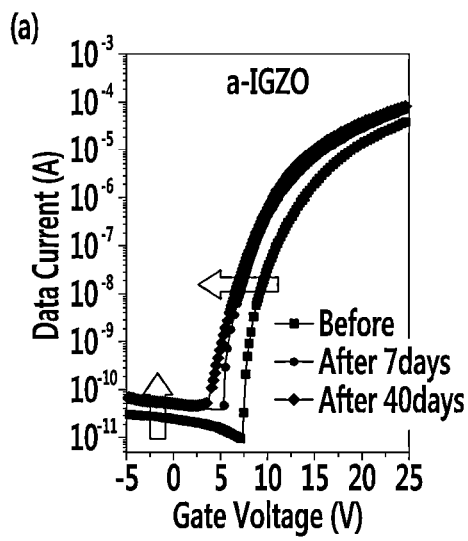
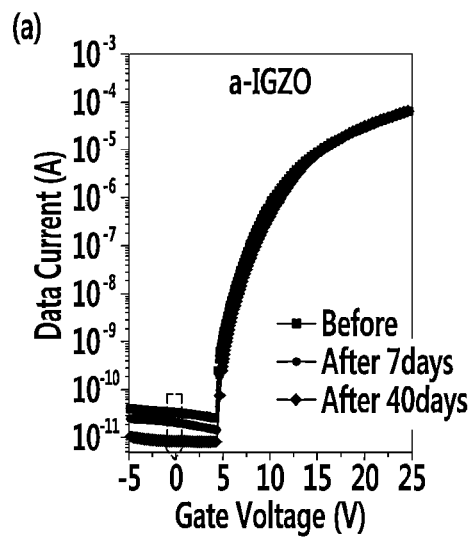
FIG. 10C
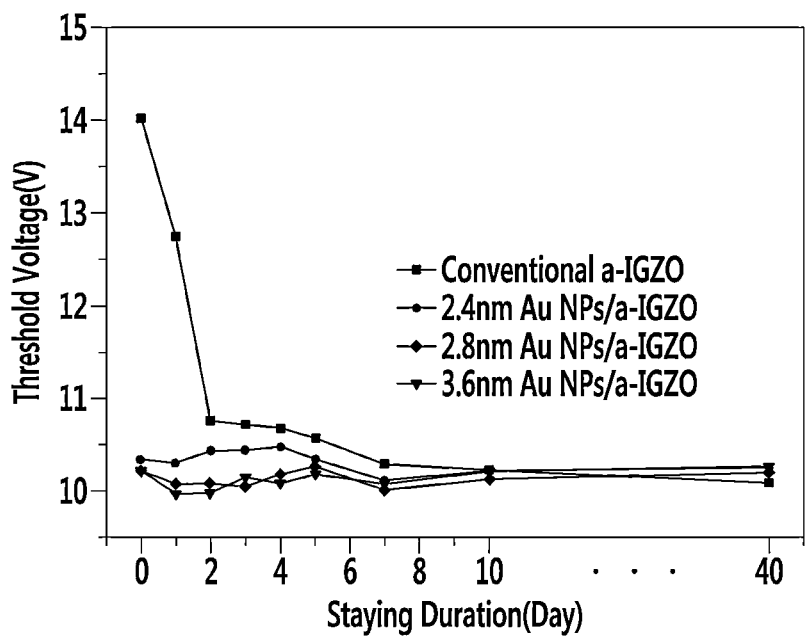

FIG. 11A
FIG. 11B
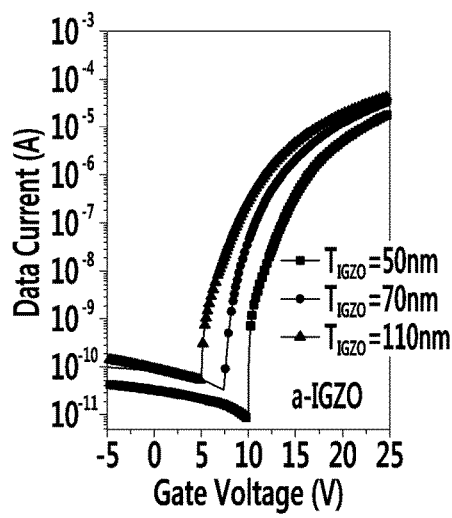
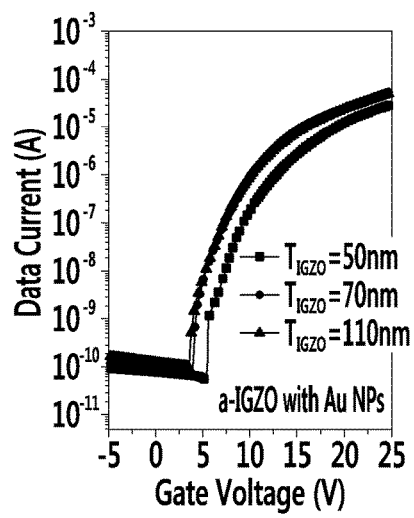

THIN FILM TRANSISTOR ARRAY PANEL

This application claims priority to Korean Patent Application No. 10-2013-0066131, filed on Jun. 10, 2013, and all the benefits accruing therefrom under 35 U.S.C. §119, the content of which in its entirety is herein incorporated by reference.

BACKGROUND (a) Technical Field

Exemplary embodiments of the invention relate to a thin film transistor array panel.

(b) Description of the Related Art

A display device typically includes a thin film transistor provided in each pixel. The thin film transistor defines a switching element using a gate electrode for receiving a switching signal, a source electrode to which a data voltage is applied, and a drain electrode for outputting a data electrode as a three terminal thereof. The thin film transistor may further include an active layer overlapping the gate electrode, the source electrode and the drain electrode. The active layer may include a semiconductor material, e.g., amorphous silicon, and may functions as a channel layer.

In a large-sized display device, a thin film transistor may be driven at a high-speed. In a conventional thin film transistor, where amorphous silicon which is typically used as the active layer, has low electron mobility, and as a result, the high-speed driving may not be effectively performed. Alternatively, thin film transistor may include low-temperature poly-silicon and an oxide semiconductor to implement high electron mobility. However, in such a thin film transistor, a processing procedure is typically complicated and uniformity of the semiconductor layer may not be effectively secured.

The thin film transistor may include an oxide semiconductor deposited by a physical vapor deposition ("PVD") method such as sputtering and evaporation, or an oxide semiconductor including a thin film formed by a coating process or a low-cost printing process. However, in such a thin film transistor array panel including an oxide semiconductor, a change in a carrier concentration may be great based on an effect such as oxygen, water, and oxygen outside the thin film transistor. Further, when the oxide semiconductor is laminated, uniformity of a thickness may be lowered during a solution process, and a characteristic of the thin film transistor may be thereby changed. Accordingly, the characteristic of the thin film transistor may be changed according to a position of the thin film transistor array panel including a plurality of thin film transistors. Further, when the oxide semiconductor is laminated by a PVD method, a density of charges in the semiconductor may be changed based on an amount of oxygen and a thickness of the oxide semiconductor.

SUMMARY

Exemplary embodiments of the invention provide a thin film transistor array panel in which a performance characteristic of a thin film transistor is substantially not changed by an external effect or an effect of a manufacturing process.

An exemplary embodiment of the invention provides a thin film transistor array panel including: a substrate; a gate electrode disposed on the substrate; a semiconductor layer disposed on the substrate and overlapping the gate electrode; a plurality of nano particles disposed on or in the semiconductor layer; and a source electrode disposed on the substrate; and a drain electrode disposed on the substrate, where the source electrode and the drain electrode are spaced apart from each other, and the semiconductor layer is disposed between the source electrode and the drain electrode, in which a diameter of each of the nano particles is in a range of about 2 nanometers (nm) to about 5 nm.

In an exemplary embodiment, the nano particles may be disposed on a first surface of the semiconductor layer, where a second surface of the semiconductor layer, which is opposite to the first surface, faces the gate electrode.

In an exemplary embodiment, the nano particles may be disposed on the surface of the semiconductor layer or inside the semiconductor layer.

In an exemplary embodiment, the nano particles may include a metal.

In an exemplary embodiment, the nano particles may include gold (Au), silver (Ag), platinum (Pt), copper (Cu), aluminum (Al), tin (Sn), indium (In), a transition metal, a metal oxide thereof, or a combination thereof, where the transition metal includes titanium (Ti), nickel (Ni), cobalt (Co), chromium (Cr), ruthenium (Ru), molybdenum (Mo), zinc (Zn), zirconium (Zr), tungsten (W), or a combination thereof.

In an exemplary embodiment, the nano particles may include a first layer including the metal and a second layer surrounding the first layer and including a metal oxide of the metal.

In an exemplary embodiment, the nano particles may have a spherical shape, a disk type, a rod type, or a plate shape.

Another exemplary embodiment of the invention provides a thin film transistor array panel, including: a substrate; a gate electrode disposed on the substrate; a semiconductor layer disposed on the substrate and overlapped with the gate electrode; a plurality of nano particles disposed in the semiconductor layer; and a source electrode disposed on the substrate; and a drain electrode disposed on the substrate, where the source electrode and the drain electrode are spaced apart from each other, and the semiconductor layer between the source electrode and the drain electrode, in which a ratio of a plane area of the nano particles per unit area of the semiconductor layer is in a range of about 5% to about 80%.

In exemplary embodiments of the thin film transistor array panel according to the invention, a performance characteristic of the thin film transistor is not changed by an external effect or an effect of a manufacturing process.

BRIEF DESCRIPTION OF THE DRAWINGS

The above and other features of the invention will become more apparent by describing in detail exemplary embodiments thereof with reference to the attached drawings, in which:

FIGS. 10A to 10C are graphs illustrating a performance of an exemplary embodiment a thin film transistor used in an Experimental Example according to the invention;

FIGS. 11A and 11B are graphs illustrating a performance of an exemplary embodiment a thin film transistor used in an Experimental Example according to the invention.

DETAILED DESCRIPTION

Figure 1:
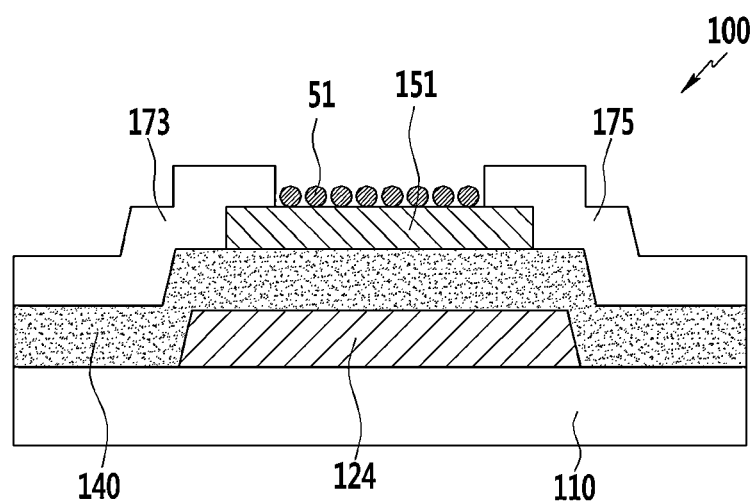
FIG. 1 is a cross-sectional view illustrating an exemplary embodiment of a thin film transistor array panel according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, an exemplary embodiment of a thin film transistor array panel according to the invention will be described with reference to FIG. 1.

FIG. 1 is a cross-sectional view illustrating an exemplary embodiment of a thin film transistor array panel according to the invention.

Referring to FIG. 1, an exemplary embodiment of a thin film transistor array panel includes an insulation substrate 110, a gate electrode 124, a gate insulating layer 140, a semiconductor layer 151, a source electrode 173, a drain electrode 175 and a plurality of nano particles 51.

The insulation substrate 110 may include an insulating material, such as glass or plastic, for example.

The gate electrode 124 is disposed on the insulation substrate 110. The gate electrode 124 may be connected to a gate wire for transferring a gate signal. The gate electrode 124 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), titanium (Ti), and tantalum (Ta), or a combination thereof.

In an exemplary embodiment, a material of the gate electrode 124 is not limited to the materials listed above, and the gate electrode 124 may include various other metals and conductors.

A gate insulating layer 140 is disposed on the insulation substrate 110 and the gate wire including the gate electrode 124. The gate insulating layer 140 may include silicon nitride (SiNx) or silicon oxynitride (SiON), for example. In such an embodiment, the gate insulating layer 140 may have a multi-layered structure including silicon oxide and silicon nitride, which may be laminated therein. In one exemplary embodiment, for example, the gate insulating layer 140 may include a silicon nitride layer disposed on the insulation substrate 110, and a silicon oxide layer disposed on the silicon nitride layer, such that the silicon oxide layer may contact the semiconductor layer 151.

In an exemplary embodiment, the gate insulating layer 140 may include a single layer including silicon oxynitride, and a concentration of oxygen may be distributed by the single layer such that a composition ratio of oxygen in the silicon oxynitride becomes high when the single layer including the silicon oxynitride is adjacent to the semiconductor layer 151. As such, in such an embodiment, where the silicon oxide layer contacts the semiconductor layer, an oxygen deficiency concentration in the semiconductor may be uniformly maintained, thereby effectively preventing deterioration of the channel layer.

The semiconductor layer 151 is disposed on the gate insulating layer 140. The semiconductor layer 151 overlaps the gate electrode 124.

The semiconductor layer 151 may include an oxide semiconductor. The semiconductor layer 151 may include oxide which is based on zinc (Zn), gallium (Ga), tin (Sn) or indium (In), or zinc oxide (ZnO), indium gallium zinc oxide ("IGZO"), indium-zinc oxide (Zn—In—O), or zinc-tin oxide (Zn—Sn—O) which is a complex oxide thereof, for example. The semiconductor layer 151 may be provided, e.g., formed, by a physical vapor deposition ("PVD") method. In detail, the semiconductor layer 151 may be an oxide semiconductor such as IGZO, gallium zinc oxide ("GZO"), indium zinc oxide ("IZO"), or hafnium indium zinc oxide ("HIZO"), for example.

In an alternative exemplary embodiment, the semiconductor layer 151 may include amorphous silicon or polycrystalline silicon.

The plurality of nano particles 51 is disposed on the semiconductor layer 151.

In an exemplary embodiment, the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

The nano particles 51 are disposed on a first surface of the semiconductor layer 151, e.g., an upper surface, where a second surface (e.g., a lower surface) of the semiconductor layer faces the gate electrode 124.

In an alternative exemplary embodiment of a thin film transistor array panel according to the invention, the nano particles 51 may be disposed on the second surface of the semiconductor layer 151, or may be disposed in the semiconductor layer 151.

Hereinafter, an exemplary embodiment of nano particles of the thin film transistor array panel according to the invention will be described with reference to FIGS. 2A and 2B.

Figure 2A:
FIGS. 2A and 2B are cross-sectional views of an exemplary embodiment of nano particles according to the invention.
Figure 2B:

FIGS. 2A and 2B are cross-sectional views of an exemplary embodiment of nano particles according to the invention.

As illustrated in FIG. 2A, each of the nano particles 51 of the thin film transistor array panel may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an alternative exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

As illustrated in FIG. 2B, each of the nano particles 51 of the thin film transistor array panel may include a metal layer 5 therein and a metal oxide layer 55 surrounding an outer surface of the metal layer 5. The metal layer 5 of the nano particles 51 may be a metal such as gold (Au), silver (Ag), platinum (Pt), copper (Cu), aluminum (Al), tin (Sn), and indium (In), or a transition metal including at least one of titanium (Ti), nickel (Ni), cobalt (Co), chromium (Cr), ruthenium (Ru), molybdenum (Mo), zinc (Zn), zirconium (Zr) and tungsten (W), for example. The metal oxide layer 55 may include a metal oxide including a metal such as gold (Au), silver (Ag), platinum (Pt), copper (Cu), aluminum (Al), tin (Sn), and indium (In), or a transition metal oxide including at least one of titanium (Ti), nickel (Ni), cobalt (Co), chromium (Cr), ruthenium (Ru), molybdenum (Mo), zinc (Zn), zirconium (Zr) and tungsten (W), for example.

According to an exemplary embodiment of the thin film transistor array panel, as shown in FIGS. 2A and 2B, the nano particles 51 have a spherical shape, but the shape of the nano particles 51 is not limited thereto. In an alternative exemplary embodiment, the nano particles 51 may have various other shapes such as a disk type, a rod type, and a plate shape, for example.

In an exemplary embodiment, where the nano particles 51 has the spherical shape, a diameter of the nano particles 51 may be in a range of about 2 nanometers (nm) to about 5 nanometers (nm), and an area ratio (%) of the nano particles 51 per surface unit area (square centimeter; $cm^2$) of the semiconductor layer 151 may be in a range of about 5% to about 80%.

Here, the area ratio (%) of the nano particles 51 per surface unit area ($cm^2$) of the semiconductor layer 151 is cross-sectional area of a nano particles 51 multiplied by a density (number/unit area ($cm^2$)) of nano particles 51, multiplied by 100%. That is, the area ratio (%) of the nano particles 51 per surface unit area ($cm^2$) of the semiconductor layer 151 means a ratio of a plane area of the nano particles per unit area of the semiconductor layer, where the plane area of the nano particles means an area of the nano particles on the semiconductor layer when viewed from a top view.

If the diameter of each of the nano particles 51 is less than about 2 nm, carriers may not be sufficiently supplied to the semiconductor layer 151, and if the diameter of each of the nano particles 51 is larger than about 5 nm, a ratio of the nano particles per unit area becomes high, and thus the nano particles 51 layer substantially covers the semiconductor layer 151 in a thin film form, and as a result, a short may occur.

When the area ratio (%) of the nano particles 51 per surface unit area ($cm^2$) of the semiconductor layer 151 is less than about 5%, the density of the nano particles 51 on the semiconductor layer 151 is very low, and as a result, an effect of the nano particles 51 is substantially reduced. When the area ratio (%) of the nano particles 51 per surface unit area ($cm^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor may not effectively function as a switching element.

According to an exemplary embodiment of the thin film transistor array panel according to the invention, the area ratio (%) of the nano particles 51 per surface unit area ($cm^2$) of the semiconductor layer 151 is in a range of about 5% to about 80%, and the conduction path is thereby effectively prevented from being formed between the nano particles 51 when the carriers are supplied to the semiconductor layer 151.

In an exemplary embodiment, a source electrode 173 and a drain electrode 175 are disposed on the semiconductor layer 151. The source electrode 173 may be connected to a data wire for transferring a data signal.

The source electrode 173 and the drain electrode 175 are disposed to be spaced apart from each other, and overlap at least a portion of the semiconductor layer 151. In such an embodiment, the source electrode 173 overlaps at least a portion of the semiconductor layer 151, and the drain electrode 175 is disposed to face the source electrode 173 based on a channel part of the thin film transistor to overlap at least a portion of the semiconductor layer 151.

The source electrode 173 and the drain electrode 175 may include a copper-based metal such as copper (Cu) and a copper alloy, an aluminum-based metal such as aluminum (Al) and an aluminum alloy, or a silver-based metal such as silver (Ag) and a silver alloy, which has low specific resistance, or a combination thereof, for example, but not being limited thereto.

In an alternative exemplary embodiment, the source electrode 173 and the drain electrode 175 may include various other metals having low specific resistance and conductors.

When a control voltage is applied to the gate electrode 124 and an input voltage is applied to the source electrode 173, charges move through the semiconductor layer 151 between the source electrode 173 and the drain electrode 175, and thus current flows therethrough.

In an exemplary embodiment, the nano particles 51 on the semiconductor layer 151 include a metal, and function as a carrier source which supplies a carrier, such as an electron, to the semiconductor layer 151 operating as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151, which may be changed based on a concentration condition of the external hydrogen, water, oxygen, and the like, may be effectively prevented. In such an embodiment, when the semiconductor layer 151 is laminated, and a thickness is thereby changed, the carrier concentration may not be changed, and as a result, the characteristic change of the thin film transistor according to a position of the thin film transistor array panel may be decreased, thereby substantially enhancing electrical stability of the thin film transistor.

In an exemplary embodiment, as shown in FIG. 1, the gate electrode 124, the gate insulating layer 140, the semiconductor layer 151, the source electrode 173 and the drain electrode 175 are sequentially laminated on one another, but the invention is not limited thereto, and a laminated structure of the thin film transistor may be different in an alternative exemplary embodiment.

In an exemplary embodiment, a passivation layer (not shown) may be disposed on the source electrode 173, the drain electrode 175, a portion of a channel region of the semiconductor layer 151 exposed by the source electrode 173 and the drain electrode 175, and the plurality of nano particles 51.

As described above, according to an exemplary embodiment of the thin film transistor array panel according to the invention, the nano particles 51 have the spherical shape, and the diameter of the nano particles 51 may be in a range of about 2 nm to about 5 nm.

An effect according to a size of the nano particles 51 will be described with reference to an Experimental Example according to the invention.

In the Experimental Example, spherical gold nano particles are formed, and while an average diameter of the nano particles is changed, density of the nano particles is calculated, and then an area ratio (%) of the nano particles 51 per surface unit area ($cm^2$) of the semiconductor layer 151 is calculated in each case, and the result is illustrated in the following Table 1.

TABLE 1

| Nano particles average diameter (d) (nm) | Nano particles density (number/$cm^2$) | Area ratio (%) of nano particles per surface unit area ($cm^2$) |
|---|---|---|
| 2 | $1.5 \times 10^{12}$ | 4.712 |
| 2.36 | $1.92 \times 10^{12}$ | 8.399 |
| 2.83 | $2.47 \times 10^{12}$ | 28.457 |
| 3.64 | $3.12 \times 10^{12}$ | 32.467 |
| 4 | $3.5 \times 10^{12}$ | 43.98 |
| 5 | $4.3 \times 10^{12}$ | 84.43 |
| 6 | $5 \times 10^{12}$ | 141.37 |

Referring to Table 1, when the average diameter of the nano particles is greater than about 5 nm, that is, when the average diameter of the nano particles is about 6 nm, the area ratio (%) of the nano particles 51 per unit area ($cm^2$) is about 141.37, that is, becomes 100% or more, and as a result, the surface of the semiconductor layer 151 may be substantially entirely covered by the nano particles.

Accordingly, as described above, when the diameter of each of the nano particles 51 is in a range of about 2 nm to about 5 nm, while the carrier is supplied to the semiconductor layer 151, the nano particles 51 layer does not entirely cover the semiconductor layer 151 as a thin film form, and as a result, a short is effectively prevented from being generated.

As described above, according to an exemplary embodiment of the thin film transistor array panel according to the invention, the area ratio (%) of the nano particles 51 per surface unit area ($cm^2$) of the semiconductor layer 151 may be in a range of about 5% to about 80%

When the area ratio (%) of the nano particles 51 per surface unit area (cm$^2$) of the semiconductor layer 151 is less than about 5%, the density of the nano particles 51 on the semiconductor layer 151 is very low, and as a result, an effect of the nano particles 51 is reduced. When the area ratio (%) of the nano particles 51 per surface unit area (cm$^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor does not effectively function as a switching element.

According to an exemplary embodiment of the thin film transistor array panel according to the invention, the area ratio (%) of the nano particles 51 per surface unit area (cm$^2$) of the semiconductor layer 151 is in a range of about 5% to about 80%, such that the conduction path is effectively prevented from being formed between the nano particles 51 when the carrier are supplied to the semiconductor layer 151.

Then, an alternative exemplary embodiment of a thin film transistor array panel according to the invention will be described with reference to FIG. 3.

Figure 3:
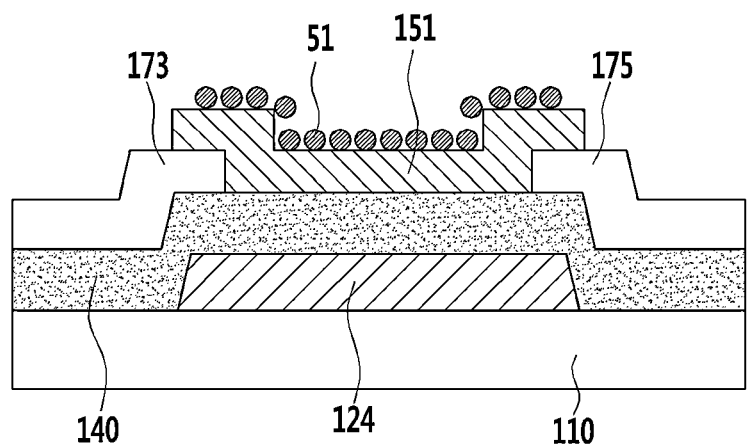
FIG. 3 is a cross-sectional view illustrating an alternative exemplary embodiment of a thin film transistor array panel according to the invention.

FIG. 3 is a cross-sectional view illustrating an alternative exemplary embodiment of a thin film transistor array panel according to the invention.

The thin film transistor array panel in FIG. 3 is substantially the same as the thin film transistor array panel shown in FIG. 1 except for except for the structure of the elements thereof. The same or like elements shown in FIG. 3 have been labeled with the same reference characters as used above to describe the exemplary embodiments of the thin film transistor array panel shown in FIG. 1, and any repetitive detailed description thereof may hereinafter be omitted or simplified.

In an exemplary embodiment, as shown in FIG. 3, a gate electrode 124 is disposed on the insulation substrate 110, and a gate insulating layer 140 is disposed on the insulation substrate 110 and the gate electrode 124.

A source electrode 173 and a drain electrode 175 are disposed on the gate insulating layer 140. The source electrode 173 and the drain electrode 175 are disposed to be spaced apart from each other, and overlaps at least a portion of a semiconductor layer 151 positioned thereon. In such an embodiment, the source electrode 173 overlaps at least a portion of the semiconductor layer 151, and the drain electrode 175 is disposed to face the source electrode 173 based on a channel portion of the thin film transistor to overlap at least a portion of the semiconductor layer 151.

The semiconductor layer 151 is disposed on the gate insulating layer 140 and the source electrode 173 and the drain electrode 175, and a plurality of nano particles 51 is disposed on the surface of the semiconductor layer 151. The semiconductor 151 overlaps at least a portion of the gate electrode 124.

In an exemplary embodiment, the semiconductor layer 151 may include an oxide semiconductor. In an alternative exemplary embodiment, the semiconductor layer 151 may include amorphous silicon or polycrystalline silicon.

The nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. The nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

The nano particles 51 are disposed on a first surface of the semiconductor layer 151, e.g., an upper surface, where a second surface (e.g., a lower surface) of the semiconductor layer faces the gate electrode 124.

In an alternative exemplary embodiment of a thin film transistor array panel according to another exemplary embodiment of the invention, the nano particles 51 may be disposed on the second surface of the semiconductor layer 151, or may be disposed in the semiconductor layer 151.

As described above with reference to FIG. 2A, the nano particles 51 may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In such an embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

In such an embodiment, as described above with reference to FIG. 2B, the nano particles 51 may include a metal layer 5 therein, and a metal oxide layer 55 surrounding an outer surface of the metal layer 5. The metal layer 5 of the nano particles 51 may include a metal such as gold (Au), silver (Ag), platinum (Pt), copper (Cu), aluminum (Al), tin (Sn), and indium (In), and a transition metal including at least one of titanium (Ti), nickel (Ni), cobalt (Co), chromium (Cr), ruthenium (Ru), molybdenum (Mo), zinc (Zn), zirconium (Zr) and tungsten (W), for example. The metal oxide layer 55 may include a metal oxide including a metal such as gold (Au), silver (Ag), platinum (Pt), copper (Cu), aluminum (Al), tin (Sn), and indium (In), for example, or a transition metal oxide including at least one of titanium (Ti), nickel (Ni), cobalt (Co), chromium (Cr), ruthenium (Ru), molybdenum (Mo), zinc (Zn), zirconium (Zr) and tungsten (W), for example.

According to an exemplary embodiment of the thin film transistor array panel, as shown in FIG. 3, the nano particles 51 have a spherical shape, but not being limited thereto. In an alternative exemplary embodiment, the nano particles 51 may have various other shapes such as a disk type, a rod type, and a plate shape, for example.

In an exemplary embodiment, where the nano particles 51 have the spherical shape, a diameter of the nano particles 51 may be in a range of about 2 nm to about 5 nm, and an area ratio (%) of the nano particles 51 per surface unit area (cm$^2$) of the semiconductor layer 151 may be in a range of about 5% to about 80%.

In an exemplary embodiment, when a control voltage is applied to the gate electrode 124 and an input voltage is applied to the source electrode 173, charges move through the semiconductor layer 151 between the source electrode 173 and the drain electrode 175, and thus current flows therethrough.

In such an embodiment, the nano particles 51 disposed on the semiconductor layer 151 include a metal, and functions as a carrier source which supplies a carrier such as an electron to the semiconductor layer 151 used as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151 which may be changed based on a concentration condition of the external hydrogen, water, oxygen, and the like, may be effectively prevented. In such an embodiment, when the semiconductor layer 151 is laminated, and a thickness is thereby changed, the carrier concentration is not changed, and as a result, the characteristic change of the thin film transistor according to a position of the thin film transistor array panel may be decreased, thereby enhancing electrical stability of the thin film transistor.

As described above, in an exemplary embodiment, where the nano particles 51 have the spherical shape, the diameter may be in a range of about 2 nm to about 5 nm.

In such an embodiment, where the diameter of the nano particles 51 is in a range about 2 nm to about 5 nm, when a carrier is supplied to the semiconductor layer 151, the nano particles 51 layer does not substantially entirely cover the semiconductor layer 151 in a thin film form, and as a result, a short is effectively prevented from being generated.

In an exemplary embodiment of the thin film transistor array panel according to the invention, an area ratio (%) of the nano particles 51 per surface unit area ($cm^2$) of the semiconductor layer 151 may be in a range of about 5% to about 80%.

When the area ratio (%) of the nano particles 51 per surface unit area ($cm^2$) of the semiconductor layer 151 is less than about 5%, the density of the nano particles 51 on the semiconductor layer 151 is very low, and as a result, an effect of the nano particles 51 is reduced. When the area ratio (%) of the nano particles 51 per surface unit area ($cm^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor does not function as a switching element.

According to an exemplary embodiment of the thin film transistor array panel, the area ratio (%) of the nano particles 51 per surface unit area ($cm^2$) of the semiconductor layer 151 is in a range of about 5% to about 80%, and the conduction path is thereby effectively prevented from being formed between the nano particles 51 when the carriers are supplied to the semiconductor layer 151.

Other features of exemplary embodiments of the thin film transistor array described above with reference to FIG. 1 may be applied to the exemplary embodiment of the thin film transistor array panel shown in FIG. 3.

Then, another alternative exemplary embodiment of a thin film transistor array panel according to the invention will be described with reference to FIG. 4.

Figure 4:
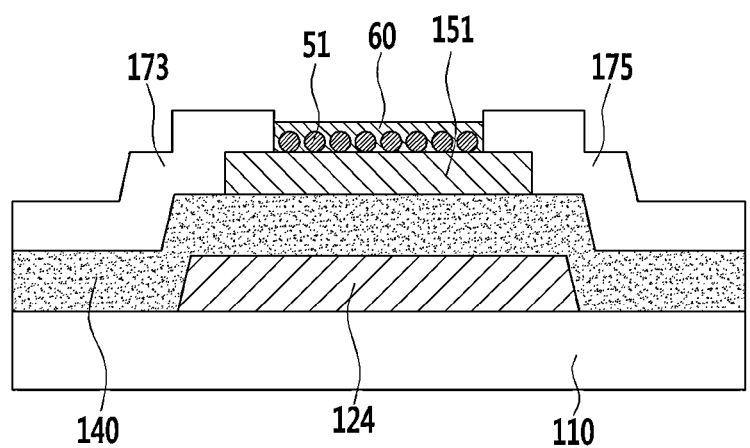
FIG. 4 is a cross-sectional view illustrating another alternative exemplary embodiment of a thin film transistor array panel according to the invention.

FIG. 4 is a cross-sectional view illustrating another alternative exemplary embodiment of a thin film transistor array panel according to the invention.

The thin film transistor array panel in FIG. 4 is substantially the same as the thin film transistor array panel shown in FIG. 1 except for an etching stop layer. The same or like elements shown in FIG. 4 have been labeled with the same reference characters as used above to describe the exemplary embodiments of the thin film transistor array panel shown in FIG. 1, and any repetitive detailed description thereof may hereinafter be omitted or simplified.

In an exemplary embodiment, as shown in FIG. 4, a gate electrode 124 is disposed on an insulation substrate 110, and a gate insulating layer 140 is disposed on the insulation substrate 110 and the gate electrode 124.

A semiconductor layer 151 is disposed on the gate insulating layer 140. A source electrode 173 and a drain electrode 175 are disposed on the gate insulating layer 140 and the semiconductor layer 151. The source electrode 173 and the drain electrode 175 are disposed to be spaced apart from each other, and overlap at least a portion of a semiconductor layer 151 positioned thereon. In such an embodiment, the source electrode 173 overlaps at least a portion of the semiconductor layer 151, and the drain electrode 175 is disposed to face the source electrode 173 based on a channel part of the thin film transistor to overlap at least a portion of the semiconductor layer 151.

A plurality of nano particles 51 is disposed on a surface of the semiconductor layer 151.

In an exemplary embodiment, an etching stop layer 60 may be disposed on a portion which is not overlapping the source electrode 173 and the drain electrode 175 of the semiconductor layer 151. The etching stop layer 60 effectively prevents the semiconductor layer 151 from being damaged by an etchant and the like, during a process of providing the source electrode 173 and the drain electrode 175 after providing the semiconductor layer 151.

The plurality of nano particles 51 is disposed between the etching stop layer 60 and the semiconductor layer 151.

The semiconductor layer 151 may include an oxide semiconductor. In an alternative exemplary embodiment, the semiconductor layer 151 may include amorphous silicon or polycrystalline silicon.

In an exemplary embodiment the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

The nano particles 51 are disposed on a first surface of the semiconductor layer 151, e.g., an upper surface, where a second surface (e.g., a lower surface) of the semiconductor layer faces the gate electrode 124.

In an alternative exemplary embodiment of a thin film transistor array panel according the invention, the nano particles 51 may be disposed on the second surface of the semiconductor layer 151, or may be disposed in the semiconductor layer 151.

As described above with reference to FIG. 2A, the nano particles 51 may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In such an embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide. In an exemplary embodiment, as described above with reference to FIG. 2B, the nano particles 51 may include a metal layer 5 therein, and a metal oxide layer 55 surrounding an outer surface of the metal layer 5. In such an embodiment, the metal layer 5 of the nano particles 51 may include a metal such as gold (Au), silver (Ag), platinum (Pt), copper (Cu), aluminum (Al), tin (Sn), and indium (In), and a transition metal including at least one of titanium (Ti), nickel (Ni), cobalt (Co), chromium (Cr), ruthenium (Ru), molybdenum (Mo), zinc (Zn), zirconium (Zr) and tungsten (W), for example. In such an embodiment, the metal oxide layer 55 may include a metal oxide including a metal such as gold (Au), silver (Ag), platinum (Pt), copper (Cu), aluminum (Al), tin (Sn), and indium (In), or a transition metal oxide including at least one of titanium (Ti), nickel (Ni), cobalt (Co), chromium (Cr), ruthenium (Ru), molybdenum (Mo), zinc (Zn), zirconium (Zr) and tungsten (W), for example.

According to an exemplary embodiment of the thin film transistor array panel, the nano particles 51 have a spherical shape, but not being limited thereto. In an alternative exemplary embodiment, the nanoparticles 51 may have various other shapes such as a disk type, a rod type, and a plate shape, for example.

In an exemplary embodiment, where the nano particles 51 have the spherical shape, a diameter of the nano particles 51 may be in a range of about 2 nm to about 5 nm, and an area ratio (%) of the nano particles 51 per surface unit area ($cm^2$) of the semiconductor layer 151 may be in a range of about 5% to about 80%.

When a control voltage is applied to the gate electrode 124 and an input voltage is applied to the source electrode 173, charges move through the semiconductor layer 151 between the source electrode 173 and the drain electrode 175 and thus current flows therethrough.

In such an embodiment, the nano particles 51 disposed on the semiconductor layer 151 include a metal, and functions as a carrier source which supplies a carrier such as an electron to the semiconductor layer 151 used as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151, which may be changed based on a concentration condition of the external hydrogen, water, oxygen, and the like, may be effectively prevented. In such an embodiment, when the semiconductor layer 151 is laminated, and a thickness is thereby changed, the carrier concentration is not changed, and as a result, the characteristic change of the thin film transistor according to a position of the thin film transistor array panel may be decreased, thereby enhancing electrical stability of the thin film transistor.

As described above, in an exemplary embodiment, where the nano particles 51 have the spherical shape, the diameter may be in a range of about 2 nm to about 5 nm.

In such an embodiment, where the diameter of each of the nano particles 51 is in a range of about 2 nm to about 5 nm, when a carrier is supplied to the semiconductor layer 151, the nano particles 51 layer does not substantially entirely cover the semiconductor layer 151 in a thin film form, and as a result, a short is effectively prevented from being generated.

In an exemplary embodiment of the thin film transistor array panel according to the invention, an area ratio (%) of the nano particles 51 per surface unit area ($cm^2$) of the semiconductor layer 151 may be in a range of about 5% to about 80%.

When the area ratio (%) of the nano particles 51 per surface unit area ($cm^2$) of the semiconductor layer 151 is smaller than about 5%, the density of the nano particles 51 on the semiconductor layer 151 is very low, and as a result, an effect of the nano particles 51 is reduced. When the area ratio (%) of the nano particles 51 per surface unit area ($cm^2$) of the semiconductor layer 151 is larger than about 80%, a distance between adjacent nano particles 51 becomes substantially close, and as a result, a conduction path is formed. When the conduction path is formed on the semiconductor layer 151, the thin film transistor does not function as a switching element.

According to an exemplary embodiment of the thin film transistor array panel, the area ratio (%) of the nano particles 51 per surface unit area ($cm^2$) of the semiconductor layer 151 is in a range of about 5% to about 80%, and the conduction path is thereby effectively prevented from being formed between the nano particles 51 when the carriers are supplied to the semiconductor layer 151.

Other features of exemplary embodiments of the thin film transistor array panel described above with reference to FIG. 1 and FIG. 3 may be applied to the exemplary embodiment of the thin film transistor array panel shown in FIG. 4.

Then, another alternative exemplary embodiment of a thin film transistor array panel according to the invention will be described with reference to FIG. 5.

Figure 5:
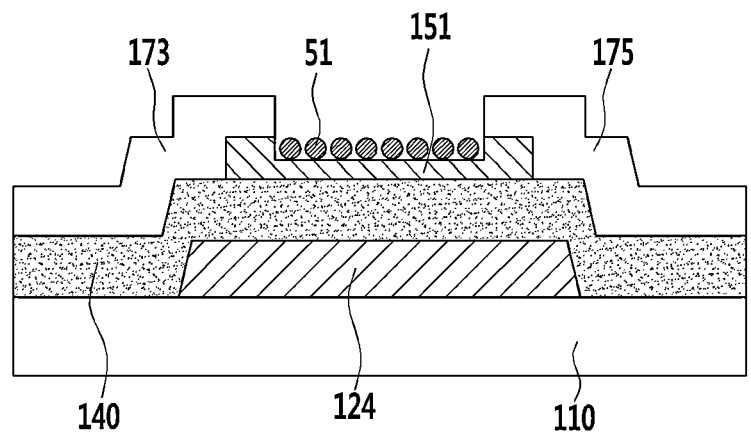
FIG. 5 is a cross-sectional view illustrating another alternative exemplary embodiment of a thin film transistor array panel according to the invention.

FIG. 5 is a cross-sectional view illustrating another alternative exemplary embodiment of a thin film transistor array panel according to the invention.

The thin film transistor array panel in FIG. 5 is substantially the same as the thin film transistor array panel shown in FIGS. 1 to 4 except for except for the structure of the elements thereof. The same or like elements shown in FIG. 5 have been labeled with the same reference characters as used above to describe the exemplary embodiments of the thin film transistor array panel shown in FIGS. 1 to 4, and any repetitive detailed description thereof may hereinafter be omitted or simplified.

A gate electrode 124 is disposed on an insulation substrate 110, and a gate insulating layer 140 is disposed on the insulation substrate 110 and the gate electrode 124.

A semiconductor layer 151 is disposed on the gate insulating layer 140. A source electrode 173 and a drain electrode 175 are disposed on the gate insulating layer 140 and the semiconductor layer 151. The source electrode 173 and the drain electrode 175 are disposed to be spaced apart from each other, and overlap at least a portion of a semiconductor layer 151 positioned thereon. In such an embodiment, the source electrode 173 overlaps at least a portion of the semiconductor layer 151, and the drain electrode 175 is disposed to face the source electrode 173 based on a channel part of the thin film transistor to overlap at least a portion of the semiconductor layer 151.

A portion of the semiconductor layer 151 that does not overlap the source electrode 173 and the drain electrode 175 is etch-backed. Accordingly, a thickness of the portion of the semiconductor layer 151 that does not overlap the source electrode 173 and the drain electrode 175 in the semiconductor layer 151 is less than a thickness of a portion of the semiconductor layer 151 that overlaps the source electrode 173 and the drain electrode 175 in the semiconductor layer 151. In such an embodiment, a thickness of a channel portion of the semiconductor layer 151 is smaller than other portions of the semiconductor layer 151.

A plurality of nano particles 51 is disposed on the surface of a channel portion of the semiconductor layer 151, which is exposed by the source electrode 173 and the drain electrode 175.

In an exemplary embodiment, the semiconductor layer 151 may include an oxide semiconductor. In an alternative exemplary embodiment, the semiconductor layer 151 may include amorphous silicon or polycrystalline silicon.

In an exemplary embodiment, the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), and a transition metal oxide, for example.

The nano particles 51 are disposed on a first surface of the semiconductor layer 151, e.g., an upper surface, where a second surface (e.g., a lower surface) of the semiconductor layer faces the gate electrode 124.

In an alternative exemplary embodiment of a thin film transistor array panel according to the invention, the nano particles 51 may be disposed on the second surface of the semiconductor layer 151, or may be disposed in the semiconductor layer 151.

As described above with reference to FIG. 2A, the nano particles 51 may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In such an embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide. In an exemplary embodiment, as described above with reference to FIG. 2B, the nano particles 51 may include a metal layer 5 therein, and a metal oxide layer 55 surrounding an outer surface of the metal layer 5. In such an embodiment, the metal layer 5 of the nano particles 51 may be a metal such as gold (Au), silver (Ag), platinum (Pt), copper (Cu), aluminum (Al), tin (Sn), and indium (In), and a transition metal including at least one of titanium (Ti), nickel (Ni), cobalt (Co), chromium (Cr), ruthenium (Ru), molybdenum (Mo), zinc (Zn), zirconium (Zr), and tungsten (W), for example. In such an embodiment, the metal oxide layer 55 may include a metal oxide including a metal such as gold (Au), silver (Ag), platinum (Pt), copper (Cu), aluminum (Al), tin (Sn), and indium (In), or a transition metal oxide including at least one of titanium (Ti), nickel (Ni), cobalt (Co), chromium (Cr), ruthenium (Ru), molybdenum (Mo), zinc (Zn), zirconium (Zr), and tungsten (W), for example.

According to an exemplary embodiment of the thin film transistor array panel, the nano particles 51 have a spherical shape, but not being limited thereto. In an alternative exemplary embodiment, the nanoparticles 51 may have various other shapes such as a disk type, a rod type, and a plate shape, for example.

In an exemplary embodiment, where the nano particles 51 have the spherical shape, a diameter of the nano particles 51 may be in a range of about 2 nm to about 5 nm, and an area ratio (%) of the nano particles 51 per surface unit area ($cm^2$) of the semiconductor layer 151 may be in a range of about 5% to about 80%.

When a control voltage is applied to the gate electrode 124 and an input voltage is applied to the source electrode 173, charges move through the semiconductor layer 151 between the source electrode 173 and the drain electrode 175, and thus current flows therethrough.

In such an embodiment, the nano particles 51 disposed on the semiconductor layer 151 includes a metal, and functions as a carrier source which supplies a carrier such as an electron to the semiconductor layer 151 used as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151, which may be changed based on a concentration condition of the external hydrogen, water, oxygen, and the like, may be effectively prevented. In such an embodiment, when the semiconductor layer 151 is laminated, and a thickness is thereby changed, the carrier concentration is not changed, and as a result, the characteristic change of the thin film transistor according to a position of the thin film transistor array panel may be decreased, thereby enhancing electrical stability of the thin film transistor.

As described above, in an exemplary embodiment, where the nano particles 51 have the spherical shape, the diameter may be in a range of about 2 nm to about 5 nm.

In such an embodiment, where the diameter of each of the nano particles 51 is in a range of about 2 nm to about 5 nm, when a carrier is supplied to the semiconductor layer 151, the nano particles 51 layer does not substantially entirely cover the semiconductor layer 151 in a thin film form, and as a result, a short is effectively prevented from being generated.

In an exemplary embodiment of the thin film transistor array panel according to the invention, an area ratio (%) of the nano particles 51 per surface unit area ($cm^2$) of the semiconductor layer 151 may be in a range of about 5% to about 80%.

When the area ratio (%) of the nano particles 51 per surface unit area ($cm^2$) of the semiconductor layer 151 is less than about 5%, the density of the nano particles 51 on the semiconductor layer 151 is very low, and as a result, an effect of the nano particles 51 is reduced. When the area ratio (%) of the nano particles 51 per surface unit area ($cm^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor does not function as a switching element.

According to an exemplary embodiment of the thin film transistor array panel, the area ratio (%) of the nano particles 51 per surface unit area ($cm^2$) of the semiconductor layer 151 is in a range of about 5% to about 80%, and the conduction path is thereby effectively prevented from being formed between the nano particles 51 when the carriers are supplied to the semiconductor layer 151.

Other features of exemplary embodiments of the thin film transistor array panel described above with reference to FIGS. 1 to 4, may be applied to the exemplary embodiment of the thin film transistor array panel shown in FIG. 5.

Then, another alternative exemplary embodiment of a thin film transistor array panel according to the invention will be described with reference to FIG. 6.

Figure 6:
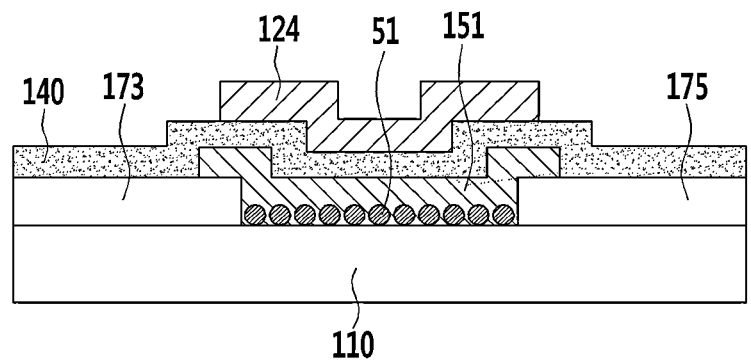
FIG. 6 is a cross-sectional view illustrating another alternative exemplary embodiment of a thin film transistor array panel according to the invention.

FIG. 6 is a cross-sectional view illustrating another alternative exemplary embodiment of a thin film transistor array panel according to the invention.

The thin film transistor array panel in FIG. 6 is substantially the same as the thin film transistor array panel shown in FIGS. 1 to 5 except for except for the structure of the elements thereof. The same or like elements shown in FIG. 6 have been labeled with the same reference characters as used above to describe the exemplary embodiments of the thin film transistor array panel shown in FIGS. 1 to 5, and any repetitive detailed description thereof may hereinafter be omitted or simplified.

A source electrode 173 and a drain electrode 175 are disposed on an insulation substrate 110. The source electrode 173 and the drain electrode 175 are spaced apart from each other at a predetermined distance.

A plurality of nano particles 51 is disposed between the source electrode 173 and the drain electrode 175.

In an exemplary embodiment, a semiconductor layer 151 is disposed on the source electrode 173 and the drain electrode 175. In such an embodiment, the semiconductor layer 151 overlaps a portion of the source electrode 173 and a portion of the drain electrode 175, and disposed on the plurality of nano particles 51 between the source electrode 173 and the drain electrode 175.

In such an embodiment, the source electrode 173 overlaps at least a portion of the semiconductor layer 151, and the drain electrode 175 is disposed to face the source electrode 173 based on a channel part of the thin film transistor to overlap at least a portion of the semiconductor layer 151.

A gate insulating layer 140 is disposed on the semiconductor layer 151, and a gate electrode 124 is disposed on the gate insulating layer 140.

In such an embodiment, the plurality of nano particles 51 is disposed on a lower surface of a channel portion of the semiconductor layer 151.

In one exemplary embodiment, for example, the semiconductor layer 151 may include an oxide semiconductor. In an alternative exemplary embodiment, the semiconductor layer 151 may include amorphous silicon or polycrystalline silicon, for example.

In an exemplary embodiment, the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

The nano particles 51 are disposed on a first surface of the semiconductor layer 151, e.g., a lower surface, where a second surface (e.g., an upper surface) of the semiconductor layer faces the gate electrode 124.

In an alternative exemplary embodiment of a thin film transistor array panel according to the invention, the nano particles 51 may be disposed on the second surface of the semiconductor layer 151, or may be disposed in the semiconductor layer 151.

As described above with reference to FIG. 2A, the nano particles 51 may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In such an embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide. In an alternative exemplary embodiment, as described above with reference to FIG. 2B, the nano particles 51 may include a metal layer 5 therein, and a metal oxide layer 55 surrounding an outer surface of the metal layer 5. In such an embodiment, the metal layer 5 of the nano particles 51 may be a metal such as gold (Au), silver (Ag), platinum (Pt), copper (Cu), aluminum (Al), tin (Sn), and indium (In), and a transition metal including at least one of titanium (Ti), nickel (Ni), cobalt (Co), chromium (Cr), ruthenium (Ru), molybdenum (Mo), zinc (Zn), zirconium (Zr), and tungsten (W), for example. In such an embodiment, the metal oxide layer 55 may include a metal oxide including a metal such as gold (Au), silver (Ag), platinum (Pt), copper (Cu), aluminum (Al), tin (Sn), and indium (In), or a transition metal oxide including at least one of titanium (Ti), nickel (Ni), cobalt (Co), chromium (Cr), ruthenium (Ru), molybdenum (Mo), zinc (Zn), zirconium (Zr), and tungsten (W), for example.

According to an exemplary embodiment of the thin film transistor array panel, the nano particles 51 have a spherical shape, but not being limited thereto. In an alternative exemplary embodiment, the nanoparticles 51 may have various other shapes such as a disk type, a rod type, and a plate shape, for example.

In an exemplary embodiment, where the nano particles 51 have the spherical shape, a diameter of the nano particles 51 may be in a range of about 2 nm to about 5 nm, and an area ratio (%) of the nano particles 51 per surface unit area ($cm^2$) of the semiconductor layer 151 may be in a range of about 5% to about 80%.

When a control voltage is applied to the gate electrode 124 and an input voltage is applied to the source electrode 173, charges move through the semiconductor layer 151 between the source electrode 173 and the drain electrode 175 and thus current flows therethrough.

In such an embodiment, the nano particles 51 disposed on the surface of the semiconductor layer 151 include a metal, and functions as a carrier source which supplies a carrier such as an electron to the semiconductor layer 151 used as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151, which may be changed based on a concentration condition of the external hydrogen, water, oxygen, and the like, may be effectively prevented. In such an embodiment, when the semiconductor layer 151 is laminated, and a thickness is thereby changed, the carrier concentration is not changed, and as a result, the characteristic change of the thin film transistor according to a position of the thin film transistor array panel may be decreased, thereby enhancing electrical stability of the thin film transistor.

As described above, in an exemplary embodiment, where the nano particles 51 have the spherical shape, the diameter may be in a range of about 2 nm to about 5 nm.

In such an embodiment, where the diameter of each of the nano particles 51 is in a range of about 2 nm to about 5 nm, when a carrier is supplied to the semiconductor layer 151, the nano particles 51 layer does not substantially entirely cover the semiconductor layer 151 in a thin film form, and as a result, a short is effectively prevented from being generated.

In an exemplary embodiment of the thin film transistor array panel according to the invention, an area ratio (%) of the nano particles 51 per surface unit area ($cm^2$) of the semiconductor layer 151 may be in a range of about 5% to about 80%.

When the area ratio (%) of the nano particles 51 per surface unit area ($cm^2$) of the semiconductor layer 151 is less than about 5%, the density of the nano particles 51 on the semiconductor layer 151 is very low, and as a result, an effect of the nano particles 51 is reduced. When the area ratio (%) of the nano particles 51 per surface unit area ($cm^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor does not function as a switching element.

According to an exemplary embodiment of the thin film transistor array panel, the area ratio (%) of the nano particles 51 per surface unit area ($cm^2$) of the semiconductor layer 151 is in a range of about 5% to about 80%, and the conduction path is thereby effectively prevented from being formed between the nano particles 51 when the carriers are supplied to the semiconductor layer 151.

Other features of exemplary embodiments of the thin film transistor array panel described above with reference to FIGS. 1 to 5, may be applied to the exemplary embodiment of the thin film transistor array panel shown in FIG. 6.

Then, another alternative exemplary embodiment of a thin film transistor array panel according to the invention will be described with reference to FIG. 7.

Figure 7:
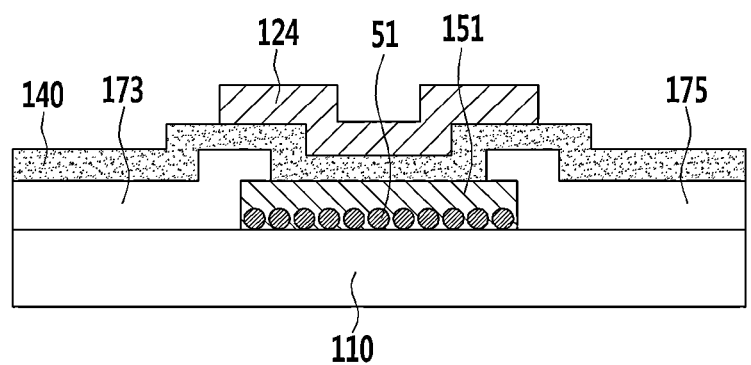
FIG. 7 is a cross-sectional view illustrating another alternative exemplary embodiment of a thin film transistor array panel according to the invention.

FIG. 7 is a cross-sectional view illustrating another alternative exemplary embodiment of a thin film transistor array panel according the invention.

The thin film transistor array panel in FIG. 7 is substantially the same as the thin film transistor array panel shown in FIGS. 1 to 6 except for the structure of the elements thereof. The same or like elements shown in FIG. 7 have been labeled with the same reference characters as used above to describe the exemplary embodiments of the thin film transistor array panel shown in FIGS. 1 to 6, and any repetitive detailed description thereof may hereinafter be omitted or simplified.

In an exemplary embodiment, as shown in FIG. 7, a semiconductor layer 151 is disposed on an insulation substrate 110. A plurality of nano particles 51 is disposed on a surface (e.g., a lower surface) of the semiconductor layer 151.

A source electrode 173 and a drain electrode 175 are disposed on the semiconductor layer 151. The source electrode 173 and the drain electrode 175 are spaced apart from each other at a predetermined distance.

The source electrode 173 overlaps at least a portion of the semiconductor layer 151, and the drain electrode 175 is disposed to face the source electrode 173 based on a channel part of the thin film transistor to overlap at least a portion of the semiconductor layer 151.

A gate insulating layer 140 is disposed on the semiconductor layer 151, and the source electrode 173 and the drain electrode 175, and a gate electrode 124 is disposed on the gate insulating layer 140.

In such an embodiment, the plurality of nano particles 51 may be disposed on the lower surface of the semiconductor layer 151.

In one exemplary embodiment, for example, the semiconductor layer 151 may include an oxide semiconductor. In an alternative exemplary embodiment, the semiconductor layer 151 may include amorphous silicon or polycrystalline silicon, for example.

In an exemplary embodiment, the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide.

The nano particles 51 are disposed on a first surface (e.g., the lower surface) of the semiconductor layer 151, where a second surface (e.g., an upper surface) of the semiconductor layer faces the gate electrode 124.

In an alternative exemplary embodiment of a thin film transistor array panel according to the invention, the nano particles 51 may be disposed on the second surface of the semiconductor layer 151, or may be disposed in the semiconductor layer 151.

As described above with reference to FIG. 2A, the nano particles 51 may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In such an embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide. In an alternative exemplary embodiment, as described above with reference to FIG. 2B, the nano particles 51 may include a metal layer 5 therein, and a metal oxide layer 55 surrounding an outer surface of the metal layer 5. In such an embodiment, the metal layer 5 of the nano particles 51 may be a metal such as gold (Au), silver (Ag), platinum (Pt), copper (Cu), aluminum (Al), tin (Sn), and indium (In), and a transition metal including at least one of titanium (Ti), nickel (Ni), cobalt (Co), chromium (Cr), ruthenium (Ru), molybdenum (Mo), zinc (Zn), zirconium (Zr), and tungsten (W), for example. In such an embodiment, the metal oxide layer 55 may include a metal oxide including a metal such as gold (Au), silver (Ag), platinum (Pt), copper (Cu), aluminum (Al), tin (Sn), and indium (In), or a transition metal oxide including at least one of titanium (Ti), nickel (Ni), cobalt (Co), chromium (Cr), ruthenium (Ru), molybdenum (Mo), zinc (Zn), zirconium (Zr), and tungsten (W), for example.

According to an exemplary embodiment of the thin film transistor array panel, the nano particles 51 have a spherical shape, but not being limited thereto. In an alternative exemplary embodiment, the nanoparticles 51 may have various other shapes such as a disk type, a rod type, and a plate shape, for example.

In an exemplary embodiment, where the nano particles 51 have the spherical shape, a diameter of the nano particles 51 may be in a range of about 2 nm to about 5 nm, and an area ratio (%) of the nano particles 51 per surface unit area (cm$^2$) of the semiconductor layer 151 may be in a range of about 5% to about 80%.

When a control voltage is applied to the gate electrode 124 and an input voltage is applied to the source electrode 173, charges move through the semiconductor layer 151 between the source electrode 173 and the drain electrode 175 and thus current flows therethrough.

In such an embodiment, the nano particles 51 disposed on the semiconductor layer 151 include a metal, and functions as a carrier source which supplies a carrier such as an electron to the semiconductor layer 151 used as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151, which may be changed based on a concentration condition of external hydrogen, water, oxygen, and the like, may be effectively prevented. In such an embodiment, when the semiconductor layer 151 is laminated, and a thickness is thereby changed, the carrier concentration is not changed, and as a result, the characteristic change of the thin film transistor according to a position of the thin film transistor array panel may be decreased, thereby enhancing electrical stability of the thin film transistor.

As described above, in an exemplary embodiment, where the nano particles 51 have the spherical shape, the diameter may be in a range of about 2 nm to about 5 nm.

In such an embodiment, where the diameter of each of the nano particles 51 is in a range of about 2 nm to about 5 nm, when a carrier is supplied to the semiconductor layer 151, the nano particles 51 layer does not substantially entirely cover the semiconductor layer 151 in a thin film form, and as a result, a short is effectively prevented from being generated.

In an exemplary embodiment of the thin film transistor array panel according to the invention, an area ratio (%) of the nano particles 51 per surface unit area ($cm^2$) of the semiconductor layer 151 may be in a range of about 5% to about 80%.

When the area ratio (%) of the nano particles 51 per surface unit area ($cm^2$) of the semiconductor layer 151 is less than about 5%, the density of the nano particles 51 on the semiconductor layer 151 is very low, and as a result, an effect of the nano particles 51 is reduced. When the area ratio (%) of the nano particles 51 per surface unit area ($cm^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor does not function as a switching element.

According to an exemplary embodiment of the thin film transistor array panel, the area ratio (%) of the nano particles 51 per surface unit area ($cm^2$) of the semiconductor layer 151 is in a range of about 5% to about 80%, and the conduction path is thereby effectively prevented from being formed between the nano particles 51 when the carriers are supplied to the semiconductor layer 151.

Other features of exemplary embodiments of the thin film transistor array panels described above with reference to FIGS. 1 to 6 may be applied to the exemplary embodiment of the thin film transistor array panel shown in FIG. 7.

Then, another alternative exemplary embodiment of a thin film transistor array panel according to the invention will be described with reference to FIG. 8.

Figure 8:
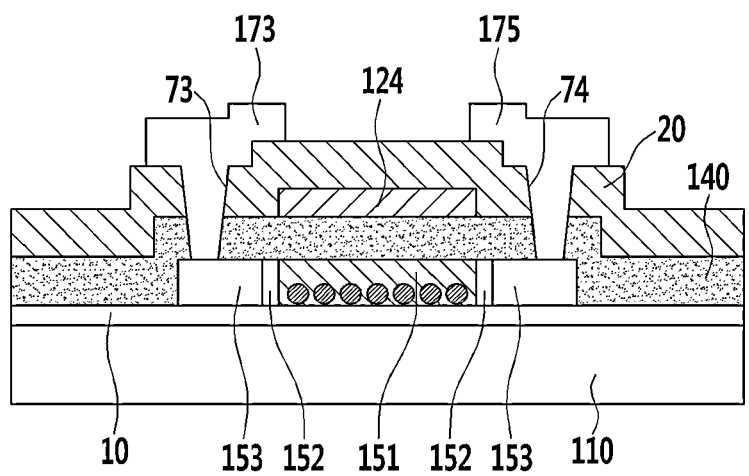
FIG. 8 is a cross-sectional view illustrating another alternative exemplary embodiment of a thin film transistor array panel according to the invention.

FIG. 8 is a cross-sectional view illustrating another alternative exemplary embodiment of a thin film transistor array panel according to the invention.

The thin film transistor array panel in FIG. 8 is substantially similar to the thin film transistor array panel shown in FIGS. 1 to 7 except for the semiconductor layer 151, an interlayer insulating layer, blocking layer and the structure of the elements thereof. The same or like elements shown in FIG. 8 have been labeled with the same reference characters as used above to describe the exemplary embodiments of the thin film transistor array panel shown in FIGS. 1 to 7, and any repetitive detailed description thereof may hereinafter be omitted or simplified.

A blocking layer 10 is disposed on an insulation substrate 110, and a semiconductor layer 151 is disposed on the blocking layer 10. A plurality of nano particles 51 is disposed on a surface (e.g., a lower surface) of the semiconductor layer 151. A channel layer of the semiconductor layer 151 is defined by an intrinsic region including substantially no impurity. A plurality of extrinsic regions which includes n-type or p-type conductive impurities is disposed around the intrinsic region. The extrinsic regions include lightly doped regions 152, a source region 153 and a drain region 155. The lightly doped regions are disposed at opposing side portions of the intrinsic region of the semiconductor layer 151, respectively, and the source region 153 and the drain region 155 are positioned at sides of the lightly doped regions, respectively.

In an alternative exemplary embodiment, the lightly doped regions may be omitted, and an offset region including substantially no impurity may be disposed at the opposing side portions of the intrinsic region of the semiconductor layer 151.

A gate insulating layer 140 is disposed on the semiconductor layer 151 and the blocking layer 10, and a gate electrode 124 is disposed on the gate insulating layer 140.

An interlayer insulating layer 20 is disposed on the gate electrode 124. The interlayer insulating layer 20 may include an inorganic insulator such as silicon nitride or silicon oxide, an organic insulator, a low-dielectric insulator and the like, for example.

In an exemplary embodiment, contact holes 73 and 74 that expose the source region 153 and the drain region 155 are defined in the interlayer insulating layer 20 and the gate insulating layer 140, and a source electrode 173 and a drain electrode 175 on the interlayer insulating layer 20 extend to the source region 153 and the drain region 155 through the contact holes 73 and 74.

In such an embodiment, the plurality of nano particles 51 is disposed on the lower surface of a channel layer of the semiconductor layer 151.

In one exemplary embodiment, for example, the semiconductor layer 151 may include polycrystalline silicon. In an alternative exemplary embodiment, the semiconductor layer 151 may include amorphous silicon or polycrystalline silicon, for example.

In an exemplary embodiment, the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In), for example. In an exemplary embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr), and tungsten (W), and a transition metal oxide, for example.

The nano particles 51 are disposed on a first surface (e.g., the lower surface) of the semiconductor layer 151, where a second surface (e.g., an upper surface) of the semiconductor layer faces the gate electrode 124.

In an alternative exemplary embodiment of a thin film transistor array panel according to the invention, the nano particles 51 may be disposed on the second surface of the semiconductor layer 151, or may be disposed in the semiconductor layer 151.

As described above with reference to FIG. 2A, in an exemplary embodiment, the nano particles 51 may have a single layer structure, and the nano particles 51 may include a metal such as gold (Au), silver (Ag), platinum (Pt), copper (Cu), aluminum (Al), tin (Sn), and indium (In), and oxides of gold (Au), silver (Ag), platinum (Pt), copper (Cu), aluminum (Al), tin (Sn), and indium (In). In such an embodiment, the nano particles 51 may include a transition metal including at least one of titanium (Ti), nickel (Ni), cobalt (Co), chromium (Cr), ruthenium (Ru), molybdenum (Mo), zinc (Zn), zirconium (Zr) and tungsten (W), for example, or a transition metal oxide. In an alternative exemplary embodiment, as described above with reference to FIG. 2B, the nano particles 51 may include a metal layer 5 therein, and a metal oxide layer 55 surrounding an outer surface of the metal layer 5. In such an embodiment, the metal layer 5 of the nano particles 51 may be a metal such as gold (Au), silver (Ag), platinum (Pt), copper (Cu), aluminum (Al), tin (Sn), and indium (In), and a transition metal including at least one of titanium (Ti), nickel (Ni), cobalt (Co), chromium (Cr), ruthenium (Ru), molybdenum (Mo), zinc (Zn), zirconium (Zr), and tungsten (W), for example. In such an embodiment, the metal oxide layer 55 may include a metal oxide including a metal such as gold (Au), silver (Ag), platinum (Pt), copper (Cu), aluminum (Al), tin (Sn), and indium (In), or a transition metal oxide including at least one of titanium (Ti), nickel (Ni), cobalt (Co), chromium (Cr), ruthenium (Ru), molybdenum (Mo), zinc (Zn), zirconium (Zr), and tungsten (W), for example.

According to an exemplary embodiment of the thin film transistor array panel, the nano particles 51 have a spherical shape, but not being limited thereto. In an alternative exemplary embodiment, the nanoparticles 51 may have various other shapes such as a disk type, a rod type, and a plate shape, for example.

In an exemplary embodiment, where the nano particles 51 have the spherical shape, a diameter of the nano particles 51 may be in a range of about 2 nm to about 5 nm, and an area ratio (%) of the nano particles 51 per surface unit area ($cm^2$) of the semiconductor layer 151 may be in a range of about 5% to about 80%.

When a control voltage is applied to the gate electrode 124 and an input voltage is applied to the source electrode 173, charges move through the semiconductor layer 151 between the source electrode 173 and the drain electrode 175 and thus current flows therethrough.

In such an embodiment, the nano particles 51 disposed on the surface of the semiconductor layer 151 include a metal, and functions as a carrier source which supplies a carrier such as an electron to the semiconductor layer 151 used as the channel layer.

In such an embodiment, when concentrations of external hydrogen, water, oxygen, and the like of the semiconductor layer 151 are changed, a carrier source may be sufficiently supplied into the semiconductor layer 151, and as a result, a change in a characteristic due to a concentration change of the carriers of the semiconductor layer 151 which may be changed based on a concentration condition of the external hydrogen, water, oxygen, and the like, may be effectively prevented. In such an embodiment, when the semiconductor layer 151 is laminated, and a thickness is thereby changed, the carrier concentration is not changed, and as a result, the characteristic change of the thin film transistor according to a position of the thin film transistor array panel may be decreased, thereby enhancing electrical stability of the thin film transistor.

As described above, in an exemplary embodiment, where the nano particles 51 have the spherical shape, the diameter may be in a range of about 2 nm to about 5 nm.

In such an embodiment, where the diameter of each of the nano particles 51 is in a range of about 2 nm to about 5 nm, even though a carrier is supplied to the semiconductor layer 151, the nano particles 51 layer does not substantially entirely cover the semiconductor layer 151 in a thin film form, and as a result, a short is effectively prevented from being generated.

In an exemplary embodiment of the thin film transistor array panel according to the invention, an area ratio (%) of the nano particles 51 per surface unit area ($cm^2$) of the semiconductor layer 151 may be in a range of about 5% to about 80%.

When the area ratio (%) of the nano particles 51 per surface unit area ($cm^2$) of the semiconductor layer 151 is less than about 5%, the density of the nano particles 51 on the semiconductor layer 151 is very low, and as a result, an effect of the nano particles 51 is reduced. When the area ratio (%) of the nano particles 51 per surface unit area ($cm^2$) of the semiconductor layer 151 is greater than about 80%, a distance between adjacent nano particles 51 becomes substantially close, and as a result, a conduction path is formed. When the conduction path is formed on the semiconductor layer 151, the thin film transistor does not function as a switching element.

According to an exemplary embodiment of the thin film transistor array panel, the area ratio (%) of the nano particles 51 per surface unit area ($cm^2$) of the semiconductor layer 151 is in a range of about 5% to about 80%, the conduction path is effectively prevented from being formed between the nano particles 51 when the carriers are supplied to the semiconductor layer 151.

Other features of exemplary embodiments of the thin film transistor array panels described above with reference to FIGS. 1 to 7 may be applied to the thin film transistor array panel shown in FIG. 8.

Then, a performance of a thin film transistor according to an Experimental Example of the invention will be described with reference to FIGS. 9A to 9D.

FIGS. 9A to 9D are diagrams illustrating a performance of a thin film transistor according to an Experimental Example of the invention.

In the Experimental Example, an oxide semiconductor layer including amorphous indium gallium oxide ("a-IGZO") is laminated, and a plurality of nano particles including gold is provided thereon. In the Experimental Example, while all other conditions are the same, various thin film transistors including the plurality of nano particles having different sizes are prepared, a current value (ampere: A) versus a gate voltage (volt: V) is measured for each thin film transistor and then the measured current value is compared with a current value according to a gate voltage in a conventional thin film transistor in which the nano particles are not provided on the surface of the semiconductor layer. The result is shown in FIGS. 9A to 9D.

Figure 9A:
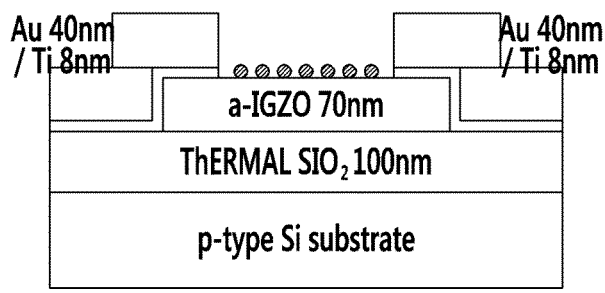
FIG. 9A to 9D are diagrams illustrating a performance of an exemplary embodiment of a thin film transistor used in an Experimental Example according to the invention.
Figure 9B:
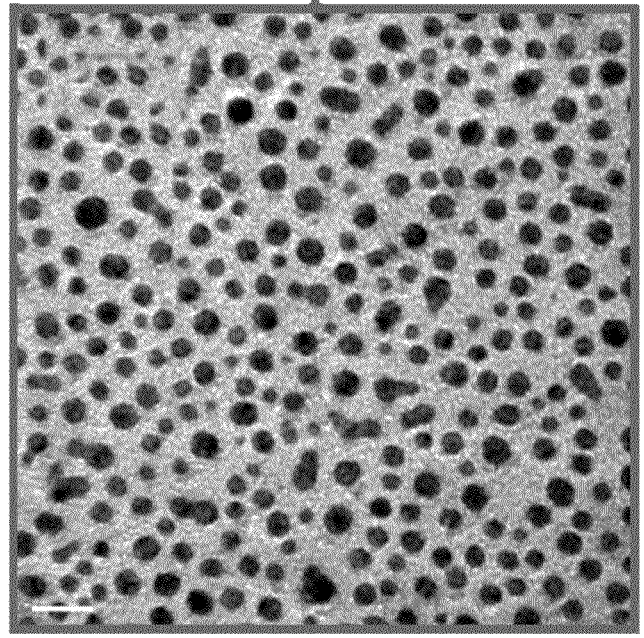
Figure 9C:
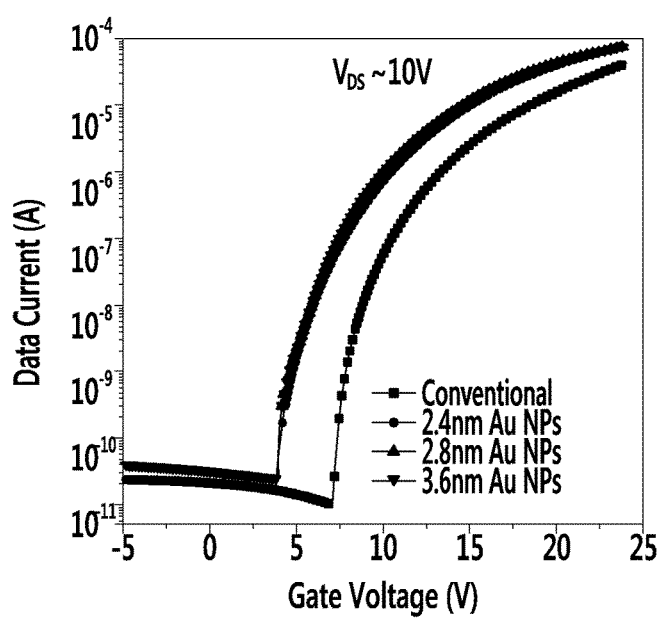
Figure 9D:
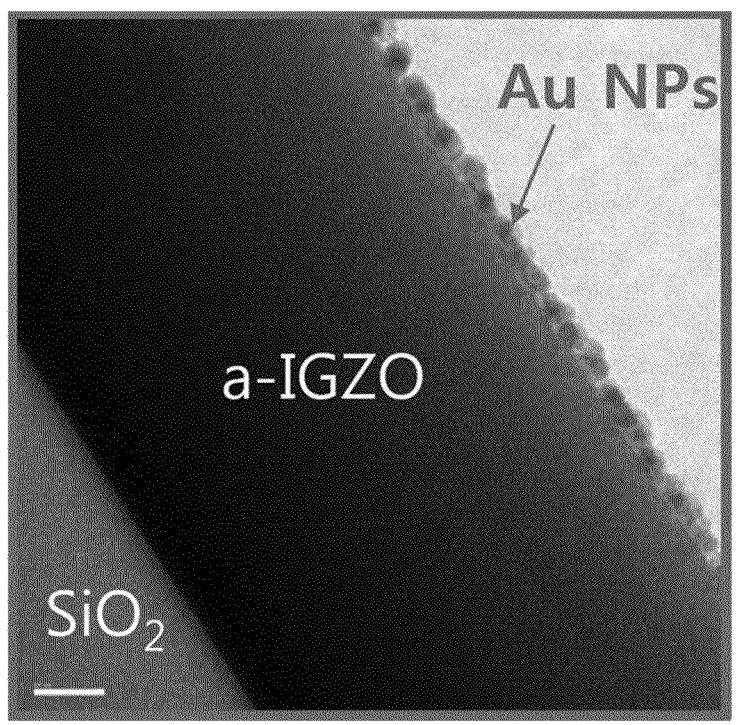

FIG. 9A illustrates a cross-sectional structure of the thin film transistor provided in the Experimental Example, FIG. 9B illustrates a microphotograph of the plurality of nano particles disposed on the semiconductor layer, FIG. 9C is a microphotograph illustrating cross sections of the gate insulating layer, the semiconductor layer and the plurality of nano particles, and FIG. 9D is a graph illustrating an experimental result of a current value according to a gate voltage according to the Experimental Example.

Referring to FIG. 9A to 9D, as compared with a conventional thin film transistor where the plurality of nano particles are not provided on the semiconductor layer, it is shown that current flows at a low gate voltage in the thin film transistor array panel, in which the plurality of nano particles (having average particles size of about 2.4 nm, about 2.8 nm, and about 3.6 nm, for example) is provided on the semiconductor layer. Accordingly, in an exemplary embodiment of the thin film transistor array panel, where the plurality of nano particles (2.4 nm, 2.8 nm, and 3.6 nm) is disposed on the semiconductor layer, the plurality of nano particles may have a substantially low threshold voltage Vth as compared with the conventional thin film transistor where the plurality of nano particles are not provided on the existing semiconductor layer. As shown in FIG. 9C, a threshold voltage Vth of the conventional thin film transistor where the plurality of nano particles are not provided on the existing semiconductor layer is about 14.02 V, while the threshold voltages Vth of the thin film transistor array panel including the plurality of nano particles (having size of about 2.4 nm, about 2.8 nm, or about 3.6 nm) on the semiconductor layer is about 10.34 V, about 10.21 V, or about 10.21 V.

Then, a performance of a thin film transistor according to an Experimental Example of the invention will be described with reference to FIGS. 10A to 10C. FIGS. 10A to 10C are graphs illustrating a performance of a thin film transistor according to an Experimental Example of the invention.

In the Experimental Example, an oxide semiconductor layer including a-IGZO is laminated, and a plurality of nano particles including gold is provided thereon. In the Experimental Example, while all other conditions are the same, various thin film transistors including the plurality of nano particles having different sizes, and a conventional thin film transistor in which nano particles are not provided on the surface of the semiconductor layer, are prepared.

In each transistor, a current value according to a gate voltage is measured, and then the measured current value is compared with a current value according to a gate voltage measured after 7 days and 40 days under humidity of about 50% and a temperature of about 50° C. Further, in each transistor, a threshold voltage Vth is measured once a day and compared with the measured current value. The result is illustrated in FIGS. 10A to 10C.

In FIG. 10A illustrates a change of a current value according to a gate voltage of the conventional thin film transistor in which nano particles are not provided on the surface of the semiconductor layer, FIG. 10B illustrates a change of a current value according to a gate voltage of a thin film transistor including nano particles on the surface of the semiconductor layer as in an exemplary embodiment of the thin film transistor array panel according to the invention, and FIG. 10C illustrates a change of a threshold voltage Vth of each transistor.

Referring to FIG. 10A, in the conventional thin film transistor in which nano particles are not provided on the surface of the semiconductor layer, when the thin film transistor is exposed under humidity of about 50% and a temperature of about 50° C., it is shown that a characteristic of the thin film transistor is changed as time passed. However, referring to FIG. 10B, in the thin film transistor array panel including the plurality of nano particles on the semiconductor layer, when the thin film transistor is exposed under humidity of about 50% and a temperature of about 50° C., it is shown that a characteristic of the thin film transistor is substantially not changed as time passed.

Referring to FIG. 10C, in the thin film transistor array panel including the plurality of the nano particles on the semiconductor layer, when the thin film transistor is exposed under humidity of about 50% and a temperature of about 50° C., it is shown that the threshold voltage Vth with an exposed time is substantially not changed. In the conventional thin film transistor in which nano particles are not provided on the surface of the semiconductor layer, when the thin film transistor is exposed under humidity of about 50% and a temperature of about 50° C., it is shown that a change of the threshold voltage Vth is large.

Then, a performance of a thin film transistor according to an Experimental Example of the invention will be described with reference to FIGS. 11A and 11B. FIGS. 11A and 11B are graphs illustrating a performance of a thin film transistor according to an Experimental Example of the invention.

In the Experimental Example, an oxide semiconductor layer including a-IGZO is laminated, and a plurality of nano particles including gold is formed thereon. In the Experimental Example, while all other conditions are the same, thin film transistor including the oxide semiconductor layers have a thickness of about 50 nm, about 70 nm, and about 110 nm, respectively, are prepared, and then a current value according to a gate voltage of each thin film transistor is measured. In addition, conventional thin film transistors, in which nano particles are not provided on the surface of the semiconductor layer, are provided, and in the conventional thin film transistors, while all other conditions are the same, the oxide semiconductor layers are provided to have a thickness of about 50 nm, about 70 nm, and about 110 nm, respectively, and then a current value according to a gate voltage of each thin film transistor is measured.

FIG. 11A illustrates a result of a current value according to a gate voltage of the conventional thin film transistors, in which nano particles are not provided on the surface of the semiconductor layer, and FIG. 11B illustrates a result of a current value according to a gate voltage of a thin film transistor including nano particles on the semiconductor layer as in an exemplary embodiment of the thin film transistor array panel according to the invention.

Referring to FIGS. 11A and 11B, in the conventional thin film transistors, in which nano particles are not provided on the surface of the semiconductor layer, it is shown that the current value according to a gate voltage is largely changed according to a thickness of the semiconductor layer that defines a channel layer. In the thin film transistor including the plurality of nano particles on the semiconductor layer, it is shown that the current value according to a gate voltage is substantially not changed according to a thickness of the semiconductor layer that defines a channel layer.

Figure 12A:
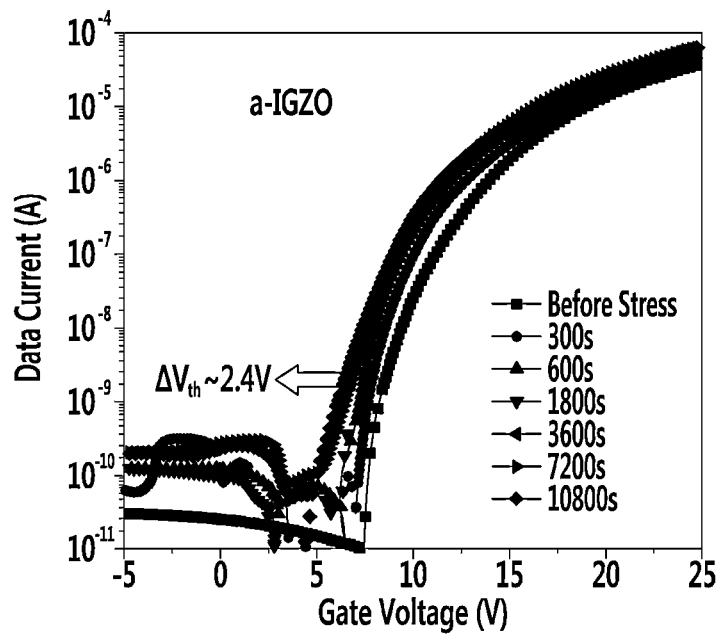
FIGS. 12A and 12B are graphs illustrating a performance of an exemplary embodiment a thin film transistor used in an Experimental Example according to the invention.
Figure 12B:
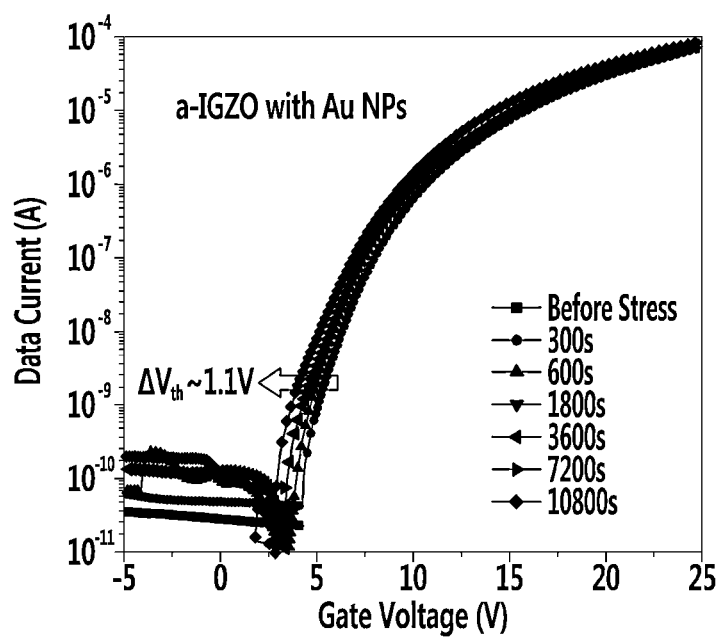

Then, a performance of a thin film transistor according to an Experimental Example of the invention will be described with reference to FIGS. 12A and 12B. FIGS. 12A and 12B are graphs illustrating a performance of a thin film transistor according to an Experimental Example of the invention.

In the Experimental Example, an oxide semiconductor layer including a-IGZO is laminated, and a plurality of nano particles including gold is disposed thereon. In the Experimental Example, while all other conditions are the same, a thin film transistor where ultraviolet ("UV") light is not applied, and the thin film transistor exposed under UV light having a wavelength of about 365 nm are prepared, a current value according to a gate voltage of the thin film transistor with an exposed time is measured for each thin film transistor. Similarly, a conventional thin film transistor, in which nano particles are not provided on the surface of the semiconductor layer, and which is not exposed under the UV light and a conventional thin film transistor exposed under the UV light having a wavelength of about 365 nm are prepared, and, a current value according to a gate voltage of the thin film transistor with an exposed time is measured for each conventional thin film transistor.

FIG. 12A illustrates a result of a current value according to a gate voltage of the conventional thin film transistors in which nano particles are not provided on the surface of the semiconductor layer, and FIG. 12B illustrates a result of a current value according to a gate voltage of the thin film transistors including nano particles on the semiconductor layer as in an exemplary embodiment of the thin film transistor array panel according to the invention.

Referring to FIG. 12, in the conventional thin film transistors in which nano particles are not provided on the surface of the semiconductor layer, it is verified shown the current value according to a gate voltage is changed as a time when the thin film transistor is exposed at the ultraviolet light is longer. In the case of the thin film transistor including the plurality of nano particles on the semiconductor layer, it is shown that the current value according to a gate voltage is not substantially changed even though a time when the thin film transistor is exposed at the ultraviolet light is longer.

As described above, in an exemplary embodiment of a the thin film transistor array panel according to the invention, where the plurality of nano particles are disposed on the semiconductor layer, a performance of the thin film transistor is not substantially changed according to an external environment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a substrate;
a gate electrode disposed on the substrate;
a semiconductor layer disposed on the substrate and overlapping the gate electrode;
a plurality of nano particles disposed on or in the semiconductor layer;
a source electrode disposed on the substrate; and
a drain electrode disposed on the substrate, wherein the source electrode and the drain electrode are spaced apart from each other, and the semiconductor layer is disposed between the source electrode and the drain electrode,
wherein a diameter of each of the nano particles is about 2 nanometers to about 5 nanometers, and
wherein the nano particles are disposed on a first surface of the semiconductor layer, where a second surface of the semiconductor layer, which is opposite to the first surface, faces the gate electrode.

2. The thin film transistor array panel of claim 1, wherein the nano particles comprise a metal.

3. The thin film transistor array panel of claim 2, wherein the nano particles comprise gold (Au), silver (Ag), platinum (Pt), copper (Cu), aluminum (Al), tin (Sn), indium (In), a transition metal, a metal oxide thereof, or a combination thereof,
wherein the transition metal comprises titanium (Ti), nickel (Ni), cobalt (Co), chromium (Cr), ruthenium (Ru), molybdenum (Mo), zinc (Zn), zirconium (Zr), tungsten (W), or a combination thereof.

4. The thin film transistor array panel of claim 2, wherein the nano particles comprise:
a first layer comprising the metal; and
a second layer surrounding the first layer and comprising a metal oxide of the metal.

5. The thin film transistor array panel of claim 1, wherein the nano particles have a spherical shape, a disk type, a rod type, or a plate shape.

6. A thin film transistor array panel comprising:
a substrate;
a gate electrode disposed on the substrate;
a semiconductor layer disposed on the substrate and overlapping the gate electrode;
a plurality of nano particles disposed on or in the semiconductor layer; and
a source electrode disposed on the substrate; and
a drain electrode disposed on the substrate, wherein the source electrode and the drain electrode are spaced apart from each other, and the semiconductor layer is between the source electrode and the drain electrode,
wherein a ratio of a plane area of the nano particles per unit area of the semiconductor layer is in a range of about 5% to about 80%, and
wherein the nano particles are disposed on a first surface of the semiconductor layer, where a second surface of the semiconductor layer, which is opposite to the first surface, faces the gate electrode.

7. The thin film transistor array panel of claim 6, wherein the nano particles include a metal.

8. The thin film transistor array panel of claim 7, wherein the nano particles comprise gold (Au), silver (Ag), platinum (Pt), copper (Cu), aluminum (Al), tin (Sn), and indium (In), a transition metal, a metal oxide thereof, or a combination thereof,
wherein the transition metal comprises titanium (Ti), nickel (Ni), cobalt (Co), chromium (Cr), ruthenium (Ru), molybdenum (Mo), zinc (Zn), zirconium (Zr), tungsten (W), or a combination thereof.

9. The thin film transistor array panel of claim 7, wherein the nano particles comprise:
a first layer including the metal; and
a second layer surrounding the first layer and comprising a metal oxide of the metal.

10. The thin film transistor array panel of claim 6, wherein the nano particles have a spherical shape, a disk type, a rod type, or a plate shape.

* * * * *

UNITED STATES PATENT AND TRADEMARK OFFICE
CERTIFICATE OF CORRECTION

| | | |
|---|---|---|
| PATENT NO. | : 9,111,789 B2 | Page 1 of 1 |
| APPLICATION NO. | : 14/209066 | |
| DATED | : August 18, 2015 | |
| INVENTOR(S) | : Byung Su Cho et al. | |

It is certified that error appears in the above-identified patent and that said Letters Patent is hereby corrected as shown below:

Title Page Item (30) Foreign Application Priority Data, insert -- June 10, 2013 (KR) ..... --10-2013-0066131 --.

Signed and Sealed this
Eighth Day of March, 2016

Michelle K. Lee
*Director of the United States Patent and Trademark Office*